(12) United States Patent
Tran

(10) Patent No.: US 6,472,891 B1
(45) Date of Patent: Oct. 29, 2002

(54) METHOD AND APPARATUS FOR TESTING SEMICONDUCTOR PACKAGES WITHOUT DAMAGE

(75) Inventor: Dean Tran, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 9 days.

(21) Appl. No.: 09/636,514

(22) Filed: Aug. 10, 2000

(51) Int. Cl.[7] ............................................... G01R 31/02
(52) U.S. Cl. ........................................ 324/755; 324/758
(58) Field of Search ................................. 324/754, 755, 324/758, 765

(56) References Cited

U.S. PATENT DOCUMENTS 4,677,474 A * 6/1987 Sato et al. ................... 324/758
5,182,076 A * 1/1993 de Seroux et al. .......... 376/250

* cited by examiner

Primary Examiner—Ernest Karlsen

(57) ABSTRACT

The accuracy of electrical tests on semiconductor packages is increased and package damage avoided by providing vacuum sensing means to determine proper seating of the package in the testing socket. Embodiments include linking operation of the testing plunger to the vacuum sensor so that the plunger is activated upon proper seating of the semiconductor package in the testing socket.

10 Claims, 1 Drawing Sheet

METHOD AND APPARATUS FOR TESTING SEMICONDUCTOR PACKAGES WITHOUT DAMAGE

TECHNICAL FIELD

The present invention generally relates to the field of semiconductor manufacture, and more particularly to accurately seating semiconductor packages for electronic testing.

BACKGROUND OF THE INVENTION

Quality control in the manufacturing of semiconductor packages is an increasingly important and costly aspect of the assembly process. Semiconductor package quality is controlled during the assembly process through intermediate and final product testing that assesses the physical and functional integrity of semiconductor packages.

Semiconductor package manufacturers implement intermediate testing procedures because they allow manufacturers to identify assembly errors before a final product has been made, thereby making any necessary semiconductor package rework less costly for several reasons. Intermediate testing allows manufacturers to more easily isolate where a semiconductor package assembly error occurred and the cause of the malfunction in a particular semiconductor package. For example, if a semiconductor package has only gone through solder and reflow steps, a manufacturer can determine that these assembly steps are the source of the semiconductor package malfunction before expending resources looking for problems more commonly associated with other assembly steps that have not yet occurred or that would have already been identified through prior testing procedures. Intermediate testing also reduces manufacturing costs because fewer parts are disassembled, examined and reassembled in order to identify an assembly error and repair the semiconductor package accordingly.

While intermediate testing affords manufacturers early assembly error detection, semiconductor package manufacturers also test the final semiconductor package to ensure that the fully assembled semiconductor package functions as intended. Under ideal circumstances, end-to-end testing ensures that semiconductor package manufacturers enjoy high production yields at the lowest possible cost. However, just as assembly errors leading to semiconductor package malfunction occur during or as a result of any of the assembly steps between testing procedures, testing itself can damage a semiconductor package.

In accordance with conventional testing methods, a semiconductor package is seated in a test socket comprising contacts that align with electrical leads on the semiconductor package. A plunger controlled by a test socket control system, is then lowered to engage the test socket and semiconductor package so that the test socket can electrically communicate with the semiconductor package through the aligned contacts and electrical leads. Once testing is complete, the plunger is lifted from the semiconductor package and the semiconductor package is removed.

Testing a semiconductor package positioned in a test socket is implemented by delivering test instructions from the test socket control system to the semiconductor package and recording the results. The test data is then analyzed and the integrity of semiconductor package is assessed. Semiconductor package manufacturers identify the circumstances under which a semiconductor package ceases to properly operate under test conditions by monitoring the variants at which the computational tests fail. A semiconductor package that correctly responds to a plurality of different test instructions by generating known predetermined outputs is assessed as having good integrity.

There are several disadvantages to conventional methods of testing semiconductor packages. One disadvantage is the damage caused by the plunger when lowered onto a test socket where the semiconductor package is not properly seated. For example, it is important to ensure that the semiconductor package is facing the correct direction, e.g., face up or face down, and is oriented properly, e.g., as when components are located in a particular position relative to the semiconductor package, to complete testing. If the semiconductor package is not properly seated, the pressure from the plunger lowered onto the semiconductor package will damage the test socket and the semiconductor package. Similarly, when the plunger is lowered onto a semiconductor package that is improperly orientated on the test socket, the electrical leads of the semiconductor package are not aligned with corresponding contacts of the test socket. If the improper orientation of a semiconductor package is not realized before the plunger is lowered onto the test socket, the improperly orientated semiconductor package and the test socket will be damaged. This practice is a waste of semiconductor package manufacturer resources because of lost time associated with semiconductor package rework, lost revenue stemming from reduced production yield, and costly and time consuming test socket repair or replacement.

In addition to the physical damage that occurs when a package is not properly seated in the test socket, improper placement also triggers false test results. For example, if a semiconductor package leads do not fully connect with the test socket contacts, the test can suggest a bad semiconductor package when the real cause of the problem is improper semiconductor package seating. This error type necessitates unnecessary additional testing and/or semiconductor package rework. Conventional testing methods make it difficult to avoid these problems because they lack the ability to easily and repeatedly monitor semiconductor package seating on a test socket before and during testing to avoid initiating or continuing testing when a semiconductor package is not properly seated in a test socket.

There exists a need for the ability to monitor and identify semiconductor packages in a testing apparatus in preparation for and during testing procedures.

SUMMARY OF THE INVENTION

The present invention provides an apparatus for testing semiconductor packages, the apparatus having a test plunger, a test socket configured to seat a semiconductor package, a vacuum sensor with a sensing element for detecting semiconductor package seating and a monitoring mechanism. The sensing element is attached in a through-hole that passes through the center ground plane of the test socket. The vacuum sensor includes a suction generator arranged so that air suctioned through the through-hole creates a high vacuum level when a semiconductor package is properly seated in the test socket and a low vacuum level when a semiconductor package is improperly seated in the test socket. The monitoring mechanism, which is attached to the vacuum sensor, determines whether a semiconductor package is properly seated in the test socket based on the vacuum level created by the suctioned air. A signal is generated when the vacuum level is low, thereby preventing the test plunger from lowering onto the improperly seated semiconductor package to initiate testing.

An advantage of the present invention is the prevention of test initiation when a package is not properly seated in the test socket, thereby reducing or eliminating damage to the semiconductor package and test socket caused by conventional testing methods when the test plunger is lowered onto the improperly seated semiconductor package.

The present invention also advantageously improves semiconductor package production efficiencies by reducing the costs associated with semiconductor package damage, unnecessary semiconductor package rework, equipment repair and replacement, and repetitive testing.

Another aspect of the present invention provides a method for testing semiconductor packages. The method includes the steps of placing a semiconductor package in a test socket of a testing apparatus and determining whether the semiconductor package is properly seated in the test socket in preparation for testing. Air is suctioned through a through-hole that passes through the center ground plane of the test socket to create a vacuum, which is used to detect whether a semiconductor package is properly seated in the test socket. A determination is made about the semiconductor package seating, whereby a semiconductor package is determined to be improperly seated in the test socket when air suctioned through the through-hole creates a low vacuum level and properly seated when the air suctioned through the through-hole creates a high vacuum level. A signal is generated when the monitoring mechanism determines that a semiconductor package is improperly seated and the test plunger is inactivated, thereby stopping test initiation. In response to a determination that a semiconductor package is properly seated in the test socket, a signal is generated, thereby activating the test plunger and initiating testing.

The present invention advantageously improves production output due to fewer damaged semiconductor packages and test sockets. The manufacturing process is also simplified by reducing or eliminating the amount of semiconductor rework and testing oversight that a semiconductor manufacturer must conduct.

Other advantages of the present invention will become readily apparent to those skilled in the art from the following detailed description. The embodiment shown and described provides illustration of the best mode contemplated for carrying out the invention. The invention is capable of modification in various obvious respects, all without departing from the invention. Accordingly, the drawing is to be regarded as illustrative in nature, and not as restrictive.

BRIEF DESCRIPTION OF THE DRAWINGS

Reference is made to the attached drawing, wherein elements having the same reference numeral designations represent like elements throughout.

DETAILED DESCRIPTION

Figure 1:
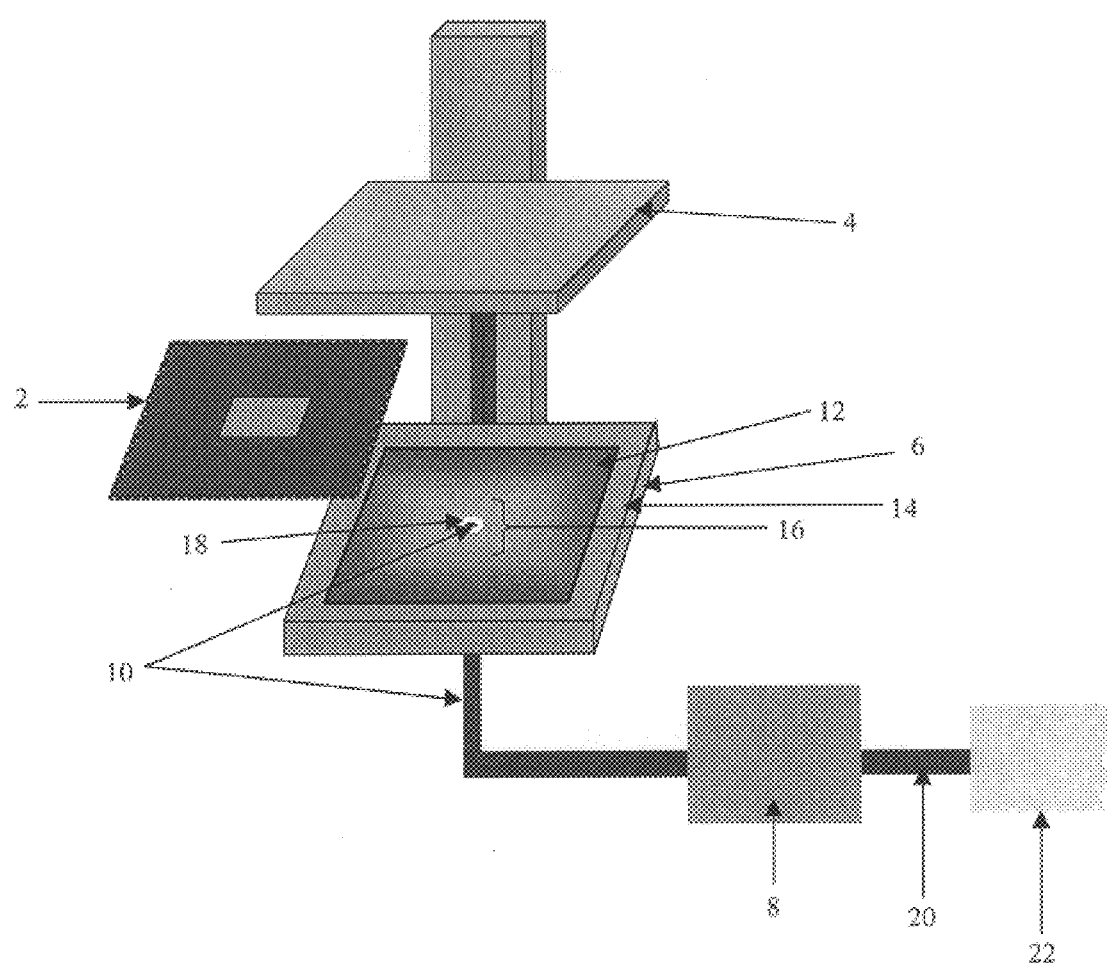
FIG. 1 shows an embodiment of the present invention comprising an apparatus for testing semiconductor packages, having a test plunger, a test socket, a vacuum sensor with a sensing element and a monitoring mechanism.

The present invention addresses and solves problems related to testing semiconductor packages. More specifically, it reduces or eliminates incidents of damage to semiconductor devices and testing equipment common with conventional testing methods when testing is initiated on a semiconductor package that is improperly seated in the test apparatus. These benefits over conventional testing methods are achieved by the real-time sensing and monitoring capabilities of the present invention.

Embodiments of the present invention comprise a testing apparatus having a test plunger and test socket, wherein a vacuum sensor with a sensing element is attached to the test socket in a manner that detects a semiconductor package's position in the test socket. The vacuum sensor is connected to a monitoring mechanism that receives and processes the semiconductor seating information generated by the vacuum sensor and sensing element and controls activation of the test plunger based on the semiconductor package seating data. An embodiment of the present invention is schematically illustrated in FIG. 1, wherein similar features bear similar references.

FIG. 1 depicts a testing apparatus comprising a test plunger 4, a test socket 6, and a vacuum sensor 8 with a sensing element 10. The test socket 4 is configured to seat a semiconductor package 2. The vacuum sensor 8 and sensing element 10 are configured to detect a semiconductor package's 2 position in the test socket 4. A monitoring mechanism 22 is configured to determine whether a semiconductor package 2 is properly seated in the test socket 4 prior to and during testing.

In an embodiment of the present invention depicted in FIG. 1, the vacuum sensor 8 is linked to the test plunger 4 so that the test plunger 4 is oriented toward the test socket 6 upon proper seating of a semiconductor package 2, thereby advantageously ensuring that when the test plunger 4 is activated and lowered towards the test socket 6, the test plunger 4 and test socket 6 are properly aligned to enable test initiation.

The test socket 6 comprises a holding pocket 12 with a top side 14, a bottom side and a center ground plane 16. A semiconductor package 2 is placed in the holding pocket 12 of the test socket 6, thus beneficially holding the semiconductor package 2 in the testing apparatus.

A through-hole 18 extends through the center ground plane 16 of the test socket 6 to the bottom side of the holding pocket 12. A sensing element 10 passes from the vacuum sensor 8 into the center ground plane through-hole 18. The sensing element 10 is attached in the through-hole 18 so the sensing element 10 is directed towards the center ground plane 16 opening of the through-hole 18, thereby advantageously enabling the vacuum sensor 8 to detect the seating of a semiconductor package 2 placed in the test socket 6.

According to an embodiment of the present invention, the testing apparatus includes a monitoring mechanism 22 that is connected to the vacuum sensor 8. The monitoring mechanism 22 includes a computer containing a software program for controlling semiconductor package 2 testing. A connection 20 runs between the vacuum sensor 8 and the monitoring mechanism 22 for transmitting signals generated by the vacuum sensor 8 and the monitoring mechanism 22. Signal transmission over the connection 20 may be duplex, half duplex or simplex. An embodiment of the present invention includes a connection 20 made from a material, e.g., coaxial cable or fiber optic cable. The connection 20 of the present invention may comprise one or more materials. The connection 20 may also be wireless, e.g., by infrared or other radio frequency transmission. It will be appreciated that other ways suitable for carrying signals can be used to form the connection 20.

The vacuum sensor 8 includes a suction generator arranged so that air suctioned through the through-hole 18 creates a high vacuum level when a semiconductor package 2 is properly seated in the test socket 6, and a low vacuum level when a semiconductor package 2 is improperly placed in the test socket 6. The monitoring mechanism 22 determines that a semiconductor package 2 is not properly seated in the test socket 6 when air suctioned through the through-hole 18 creates a low vacuum level, thereby avoiding manufacturing inefficiencies and errors associated with determining semiconductor package 2 seating using conventional testing methods.

A signal is generated when the monitoring mechanism 22 determines that a semiconductor package 2 is not properly seated in the test socket 6, thereby preventing the test plunger 4 from being lowered onto the improperly seated semiconductor device 2 to initiate testing. According to an embodiment of the present invention, the vacuum sensor 8 generates a signal when the monitoring mechanism 22 determines that a semiconductor package 2 is improperly seated in the test socket 6, thereby inactivating the test plunger 4. In alternative embodiments of the present invention, the test plunger 4 may be inactivated by a signal generated by the monitoring mechanism 22 or other components of the testing apparatus. The ability to monitor and detect semiconductor package 2 seating and control test plunger 4 activation reduces incidents of damage to semiconductor packages 2 common with conventional testing methods by preventing test initiation in instances when a semiconductor package 2 is not properly seated in the test socket 6.

The present invention also comprises a method of testing semiconductor packages comprising placing a semiconductor package in a test socket of a testing apparatus and determining whether the semiconductor package is properly seated in the test socket. Embodiments include protecting semiconductor packages from damage by reducing or eliminating incidents where testing is initiated on semiconductor packages that are not properly seated in the testing apparatus. In an embodiment of the present invention, the semiconductor package is placed in a test socket having a semiconductor package holding pocket with a top side, a bottom side and a center ground plane. A through-hole passes through the center ground plane to the bottom side of the semiconductor holding pocket.

A sensing element passes from a vacuum sensor through the center ground plane through-hole and is attached in the through-hole with the sensing element directed towards the center ground plane opening of the through-hole and the semiconductor package seated in the test socket.

Air is suctioned through the through-hole to create a vacuum to determine whether the semiconductor package is properly seated in the test socket. The semiconductor package is not properly seated in the test socket when air suctioned through the through-hole creates a low vacuum level. A signal is generated when the monitoring mechanism determines that a semiconductor package is not properly seated in the test socket, as indicated by a low vacuum level. According to an embodiment of the present invention, the signal is generated by the vacuum sensor. It should be recognized that the monitoring mechanism or other components of the testing apparatus may also generate the signal. The test plunger is inactivated when a signal is generated indicating that a semiconductor package is not properly seated in the test socket to prevent the plunger from being lowered onto the semiconductor package to initiate testing, thereby avoiding damage associated with conventional methods when the test plunger is lowered onto a test socket when the semiconductor package is not properly seated.

When air suctioned through the through-hole creates a high vacuum level, a semiconductor package is properly seated in the test socket. A signal is generated when the monitoring mechanism determines that a semiconductor package is properly seated, thus activating the test plunger to be lowered onto the test socket and semiconductor package to initiate testing.

The present invention beneficially increases the efficient use of semiconductor package manufacturer resources by eliminating lost time associated with semiconductor package rework, lost revenue stemming from reduced production yield, and costly and time consuming test socket repair or replacement.

In addition, the present invention enables semiconductor package manufacturers to control circumstances that trigger false test results. Conventional testing methods make it difficult to avoid false test results because they lack the ability to easily and repeatedly monitor semiconductor package seating in a test socket before and during testing. Ensuring that a semiconductor package is properly seated in the test socket, thereby allowing the semiconductor package leads to fully connect with the test socket contacts, increases the opportunity for accurate testing and avoids unnecessary additional testing and/or semiconductor package rework associated with improper semiconductor package seating in the test socket.

The present invention enjoys industrial applicability in fabricating any of various types of semiconductor packages. The present invention has particular applicability in detecting and monitoring semiconductor package seating in preparation for and during semiconductor package testing.

Only the preferred embodiment of the present invention and but a few examples of its versatility are shown and described in the present disclosure. It is to be understood that the present invention is capable of use in various other combinations and environments and is capable of changes and modifications within the scope of the inventive concept as expressed herein.

What is claimed is:

1. An apparatus for testing a semiconductor package, the apparatus comprising:
   a test plunger;
   a test socket configured to seat a semiconductor package;
   a vacuum sensor having a sensing element configured to detect a semiconductor package position in a test socket; and
   a monitoring mechanism configured to determine whether a semiconductor package is properly seated in the test socket.

2. The apparatus according to claim 1, wherein the vacuum sensor is linked to the test plunger so that the test plunger is oriented toward the test socket upon proper seating of the semiconductor package.

3. The apparatus according to claim 2, wherein the test socket comprises:
   a holding pocket with a top side, a bottom side and a center ground plane; and
   a through-hole extending through the center ground plane to the bottom side of the holding pocket.

4. The apparatus according to claim 3, wherein the sensing element attached in the through-hole with the sensing element directed towards the center ground plane opening of the through-hole.

5. The apparatus according to claim 4, wherein the monitoring mechanism is connected to the vacuum sensor.

6. The apparatus according to claim 5, wherein the monitoring mechanism includes:
   a computer containing a software program for controlling semiconductor package testing; and
   an electrical connection between the vacuum sensor and testing apparatus for transmitting signals generated by the vacuum sensor to the testing apparatus for processing by the software program.

7. The apparatus according to claim 6, wherein the vacuum sensor includes a suction generator arranged so that air suctioned through the through-hole creates a high vacuum level for a semiconductor package properly placed on a test socket and a low vacuum level for a semiconductor package improperly placed on a test socket.

8. The apparatus according to claim 7, wherein the monitoring mechanism determines a semiconductor package is not properly seated in the test socket when air suctioned through the through-hole creates a low vacuum level.

9. The apparatus according to claim 8, wherein a signal is generated when the monitoring mechanism determines that a semiconductor package is not properly seated in the test socket.

10. The apparatus according to claim 9, wherein the vacuum sensor generates a signal when a semiconductor package is not properly seated in the test socket indicative of a low vacuum level, thereby preventing the test plunger from being lowered onto the semiconductor package to initiate testing.

* * * * *